(12) United States Patent
Wang et al.

(10) Patent No.: US 6,351,078 B1
(45) Date of Patent: Feb. 26, 2002

(54) PIXEL STRUCTURE OF AN ORGANIC LIGHT-EMITTING DIODE DISPLAY DEVICE

(75) Inventors: Wen-Chun Wang, Taichung; Cheng-Hsien Han, Hsinchu, both of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/689,039

(22) Filed: Oct. 11, 2000

(30) Foreign Application Priority Data

Aug. 25, 2000 (TW) ........................................ 89117252 A (51) Int. Cl.[7] .............................................. G09G 3/10
(52) U.S. Cl. ........................ 315/169.3; 315/169.4; 345/76; 345/82; 345/92; 345/90; 313/498; 313/499; 313/500
(58) Field of Search ............................ 315/169.3, 169.4; 345/76, 82, 92, 90; 313/498, 499, 500

(56) References Cited

U.S. PATENT DOCUMENTS

| | | | | |
|---|---|---|---|---|
| 5,550,066 A | | 8/1996 | Tang et al. | 437/40 |
| 5,684,365 A | * | 11/1997 | Tang et al. | 315/169.3 |
| 5,748,160 A | * | 5/1998 | Shieh et al. | 345/82 |
| 5,786,796 A | * | 7/1998 | Takayama et al. | 345/76 |
| 6,084,579 A | * | 7/2000 | Hirano | 345/205 |
| 6,175,345 B1 | * | 1/2001 | Kuribayashi et al. | 345/76 |
| 6,229,506 B1 | * | 5/2001 | Dawson et al. | 345/82 |

* cited by examiner

*Primary Examiner*—Don Wong
*Assistant Examiner*—Tuyet T. Vo (57) ABSTRACT

A pixel structure of an organic light-emitting diode (OLED) display device connects a resistor in series with the source electrode of a thin film transistor to increase the illumination uniformity of pixels of the OLED display device. The pixel structure comprises first and second thin film transistors (TFT), a storage capacitor, a resistor and an OEL element. A negative feedback loop is formed by the connection of the resistor in series with the source electrode of the second TFT which can be a p-type or an n-type thin film transistor. When the current of the OLED is within the micro-amp level and the resistance level of the resistor is within the million-ohm level, the current-voltage characteristic curves have more linear relationship and the switching of gray-level brightness becomes easier.

13 Claims, 12 Drawing Sheets

PIXEL STRUCTURE OF AN ORGANIC LIGHT-EMITTING DIODE DISPLAY DEVICE

FIELD OF THE INVENTION

The present invention relates generally to a pixel structure of a light-emitting diode (LED) display device, and more particularly to a pixel structure of an organic light-emitting diode (OLED) display device.

BACKGROUND OF THE INVENTION

Current electronic display products include cathode ray tubes (CRT), plasma display panels, light-emitting diodes, and thin-film electroluminescent devices. Any display device to be accepted in the electronic display market must provide features of high resolution, full-color display with good light intensity and competitive price.

For a conventional passive organic luminescent device, although its manufacturing process is simple and manufacturing cost is less expensive, its resolution is not high. It is acceptable only for a small-area and low-resolution display device. On the contrary, an active drive organic light-emitting diode display device using thin-film-transistors (TFT) in an active-addressing scheme has features of high resolution and low power consumption. Technology using organic thin-film material to manufacture lighting device is proved to be a great advance in flat-panel display technologies. This technology has made high brightness, wide range of color, long lifetime, low temperature fabrication and low-voltage drive displays possible.

In a two-terminal scheme, the organic display medium is sandwiched between two sets of orthogonal electrodes (rows and columns). Thus, the organic electroluminescent (OEL) element serves both the display and switching functions. The current required by the OEL elements is supplied via the row and column buses. Because of the instantaneous high current, the IR potential drops along these buses are insignificant compared with the OEL driving voltage. Since the brightness-voltage characteristic of the OEL is nonlinear, any variation in the potential along the buses will result in a non-uniform pixel illumination.

U.S. Pat. No. 5,550,066 discloses a process for making an active matrix four-terminal TFT electroluminescent device in which an organic material is used as the electroluminescent medium. In this TFT-OEL display device, the IR potential drops along the buses are insignificant. Also, the uniformity of the pixel illumination is not significantly affected by the size of the display device.

Figure 1:
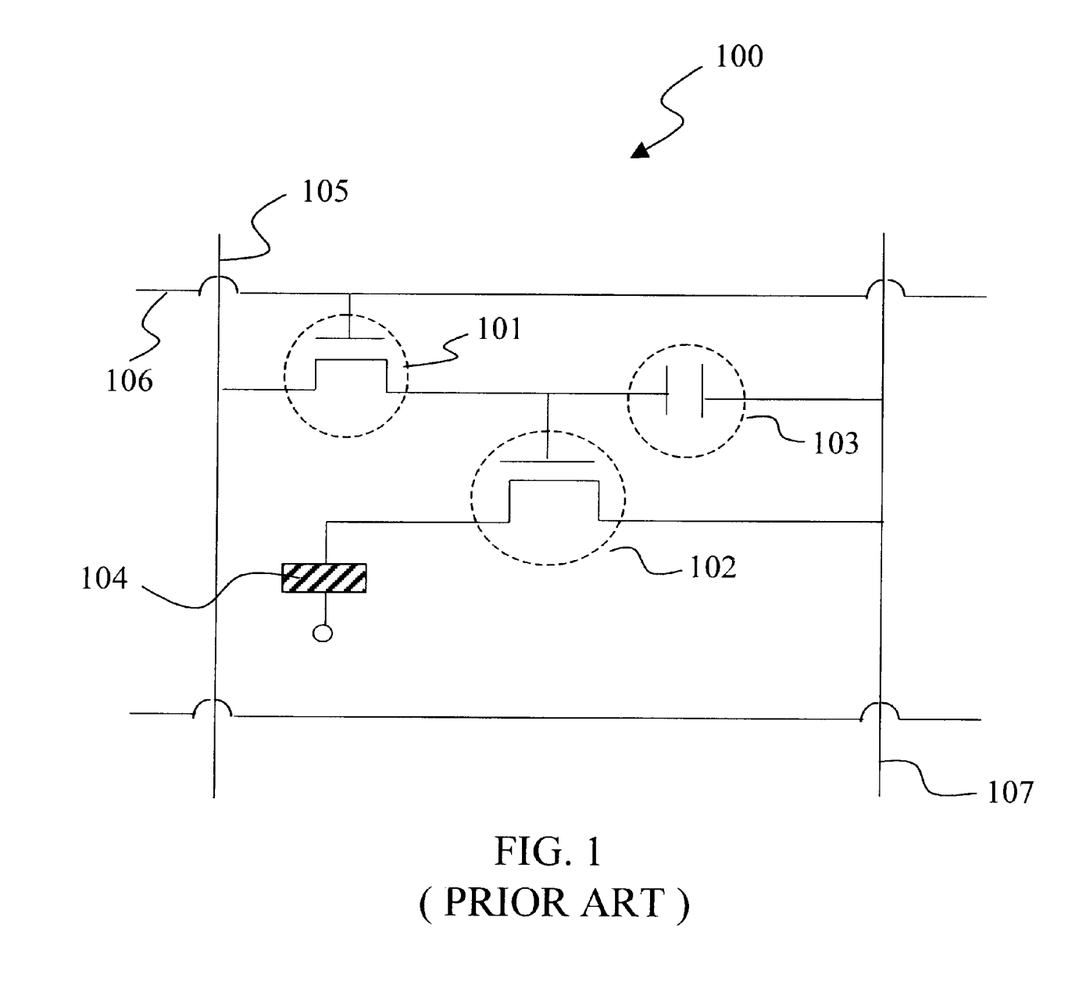
FIG. 1 is a schematic diagram of a pixel structure of a conventional active matrix four-terminal TFT-OEL device.

FIG. 1 is a schematic diagram of a pixel structure of the conventional active matrix four-terminal TFT-OEL device. As shown in FIG. 1, each pixel structure 100 comprises two thin film transistors 101 and 102, a storage capacitor 103 and an OEL pad 104 arranged on a substrate. The drain electrode of the TFT 102 is electrically connected to the OEL pad 104. The source electrode is electrically connected to the ground bus 107. The gate electrode is electrically connected to the storage capacitor 103. The TFT 102 is the logic transistor with the source bus as the data line 105 and the gate bus as the gate line 106. The drain electrode of the TFT 101 is electrically connected to the gate electrode of the TFT 102 which in turn is electrically connected to the storage capacitor 103 so that following an excitation signal the TFT 102 is able to supply a nearly constant current to the OEL pad 104 between signals.

However, because the OEL element is driven by current, if a TFT is used to supply current to the OEL element and to serve as an active drive element in order to form a type of an active matrix drive, then the uniformity of the TFT-driven current on the glass substrate of the display becomes very important. For low-temperature poly Si (LTPS) thin film transistors, the pixel illumination of the OEL element is very non-uniform under the condition of poor control of the driving current.

SUMMARY OF THE INVENTION

The present invention has been made to overcome the above-mentioned drawbacks of a conventional organic light-emitting display device. The primary object of the invention is to provide a pixel structure of an OLED display device. The pixel structure of an OLED display device connects a resistor in series with the source electrode of a thin film transistor to increase the illumination uniformity of each pixel of the OLED display device.

The pixel structure of an OLED display device of the invention comprises mainly first and second thin film transistors, a storage capacitor, a resistor and an OEL element. The resistor is connected in series with the source electrode of the second thin film transistor. It can be active or passive.

According to the invention, a negative feedback loop is formed by the connection of the resistor in series with the source electrode of the second TFT. The illumination uniformity of every pixel of the OLED display device is then improved.

In the preferred embodiments of the invention, the second TFT can be a p-type or an n-type thin film transistor. In this invention, the relationship between the current of the drain electrode of the second TFT and the voltage of the gate electrode of the second TFT is analyzed by connecting a resistor of various resistance levels in series with the source electrode of the second TFT. When the current of the OLED is within the micro-amp level and the resistance level of the resistor is within the million-ohm level, the current-voltage characteristic curves have more linear relationship and the switching of gray-level brightness becomes easier.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 2A:
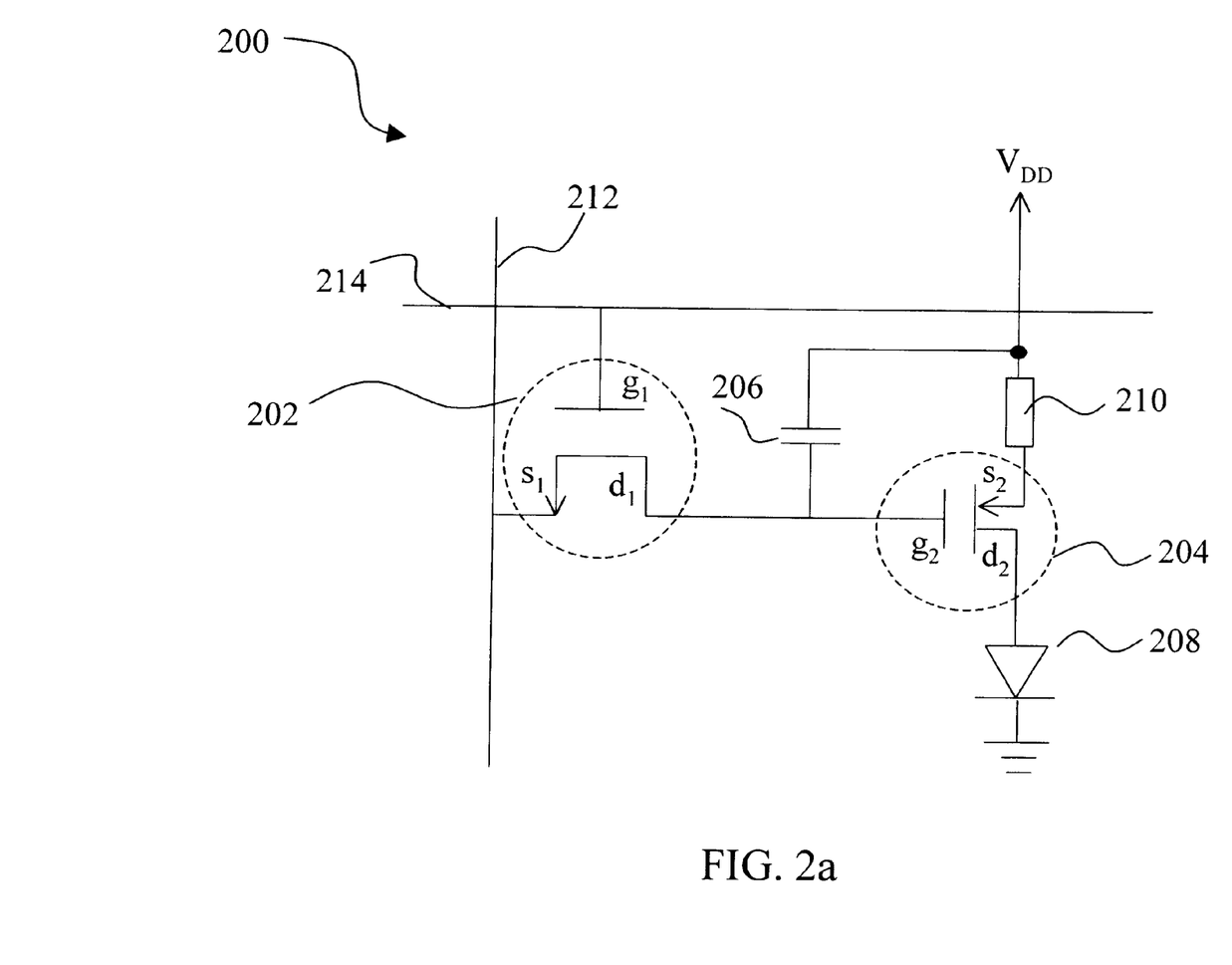
FIG. 2a and FIG. 2b show respectively schematic diagrams of the first and second embodiments of a pixel structure of an organic light-emitting diode display device according to the invention.
Figure 2B:
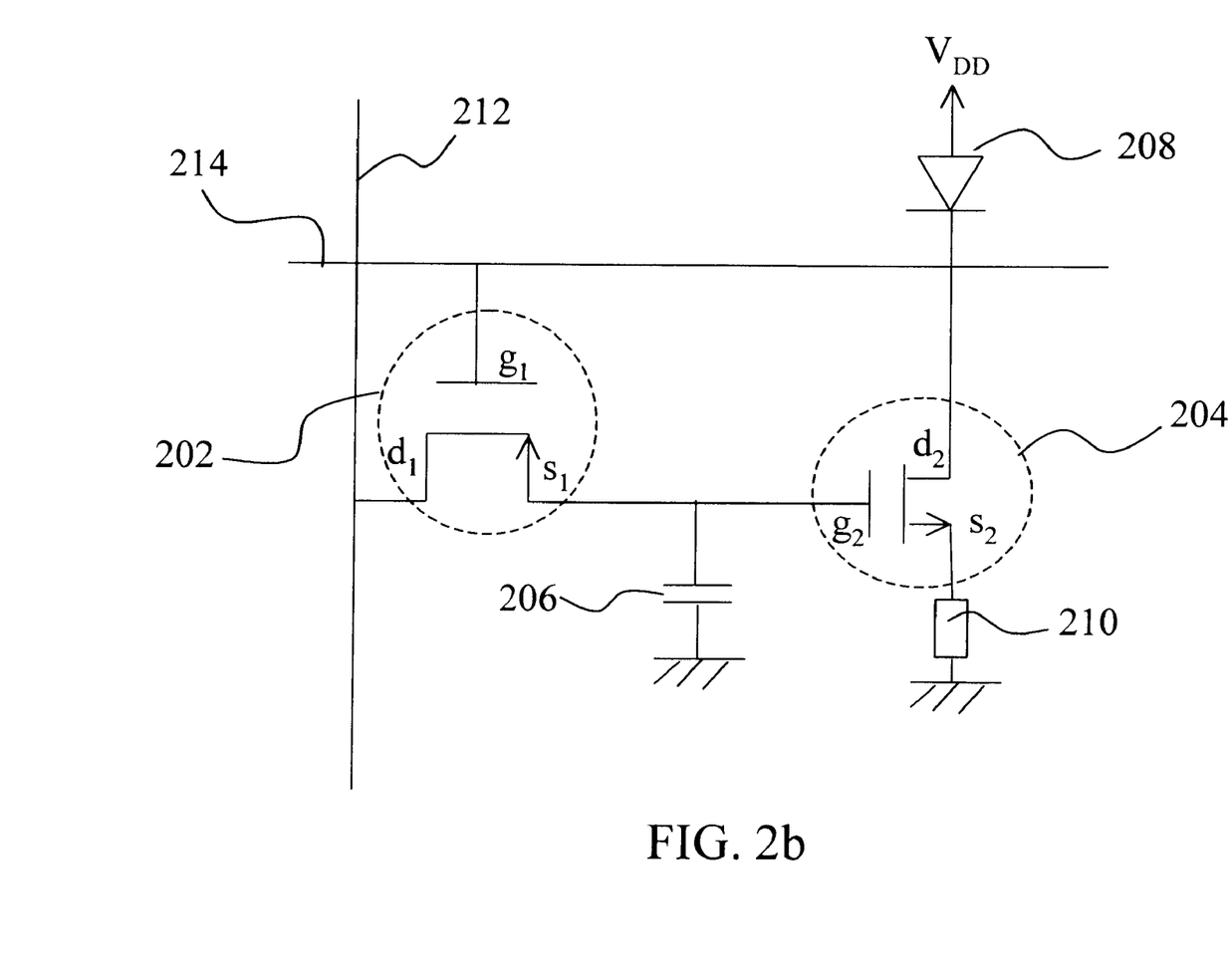

FIG. 2a and FIG. 2b show respectively schematic diagrams of the first and second embodiments of a pixel structure of an OLED display device according to the invention. Note that the second TFT being connected in series with a resistor in FIG. 2a is a p-type TFT and the corresponding one in FIG. 2b is an n-type TFT.

Referring to FIG. 2a, the pixel structure 200 of an OLED display device of the invention comprises a first thin film transistor 202, a second thin film transistor 204, a storage capacitor 206, an OEL element 208 and a resistor 210. The OEL element 208 is composed of an organic electroluminescent layer sandwiched between a transparent anode layer and a cathode metal layer. The first TFT 202 comprises a drain electrode $d_1$, a source electrode $s_1$ and a gate electrode $g_1$. The second TFT 204 also comprises a drain electrode $d_2$, a source electrode $s_2$ and a gate electrode $g_2$. The drain electrode $d_2$ of the second TFT 204 is electrically connected to the OEL element 208. The source electrode $s_2$ is connected in series with the resistor 210. The gate electrode $g_2$ is electrically connected to the storage capacitor 206. The drain electrode $d_1$ of the first TFT 202 is electrically connected to the gate electrode $g_2$ of the second TFT 204. The source electrode $s_1$ is connected to the data line 212. The gate electrode $g_1$ is connected to the gate line 214.

One end of the resistor 210 is connected to the voltage source $V_{dd}$ and the storage capacitor 206. The OEL element 208 has one end connected to the ground. As shown in FIG. 2a, a negative feedback loop is formed by the connection of the resistor 210 in series with the source electrode $s_2$ of the second TFT 204. The non-uniformity of the driving current-voltage characteristic of the OEL, caused by the poor control of the threshold voltage of the second TFT 204, is insignificant. Therefore, the illumination uniformity of every pixel of the OLED display device is improved.

Referring to FIG. 2b, the second TFT 204 being connected in series with the resistor 210 is an n-type TFT. The schematic diagram of FIG. 2b is a little different from that of FIG. 2a. For convenience, the following describes only the difference. As shown in FIG. 2b, one end of the OEL element 208 is electrically connected to the drain electrode $d_2$ of the second TFT 204 and the other end is connected to the voltage source $V_{dd}$. One end of the resistor 210 is connected in series with the source electrode $s_2$ of the second TFT 204 and the other end is connected to the ground. One end of the storage capacitor 206 is electrically connected to the gate electrode $g_2$ of the second TFT 204 and the other end is connected to the ground. The source electrode $s_1$ of the first TFT 202 is electrically connected to the storage capacitor 206 and the gate electrode $g_2$ of the second TFT 204. The source electrode $s_1$ is connected to the data line 212. The gate electrode $g_1$ is connected to the gate line 214.

Figure 3:
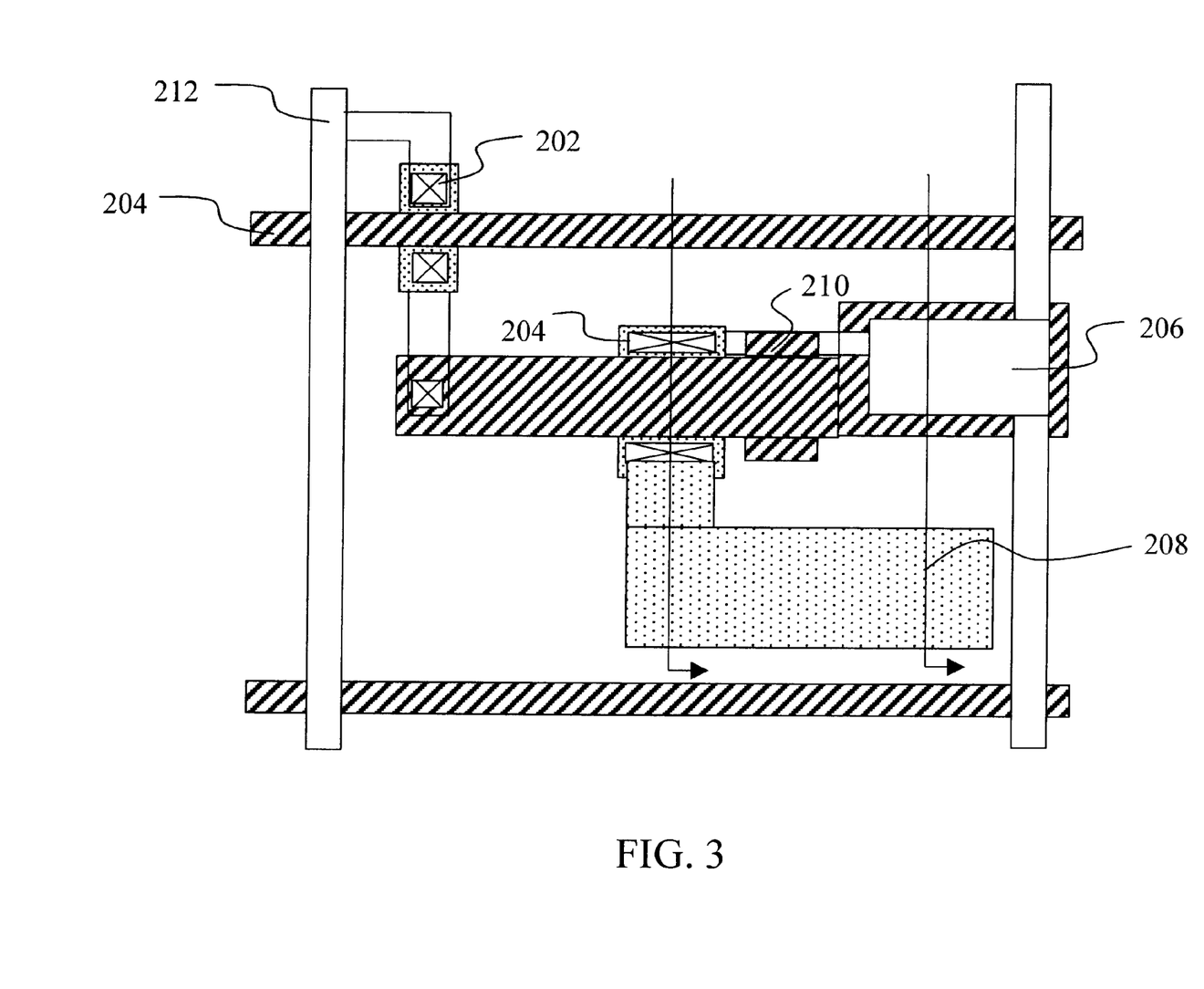
FIG. 3 is a diagrammatic plan view of a pixel structure of an organic light-emitting diode display device according to the invention.

The pixel structure of the OLED display device of the invention is connected and fabricated on the top surface of an insulating substrate having top and bottom surfaces. FIG. 3 is a diagrammatic plan view of a pixel structure of an organic light-emitting diode display device according to the invention. As shown in FIG. 3, one end of the resistor 210 is connected in series with the second TFT 204 and the other end is connected to the storage capacitor 206.

Figure 4A:
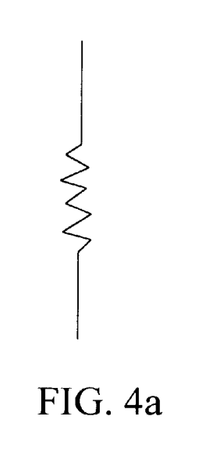
FIG. 4a is a schematic diagram of a passive resistor.
Figure 4B:
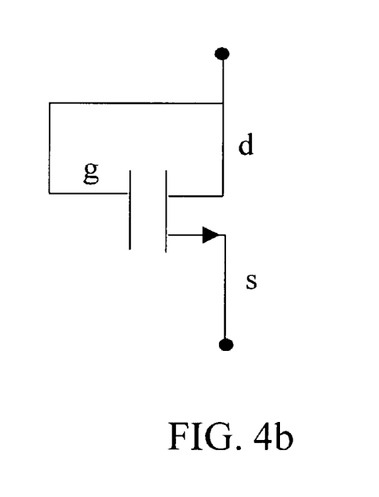
FIGS. 4b–4e are four schematic diagrams of an active resistor.
Figure 4C:
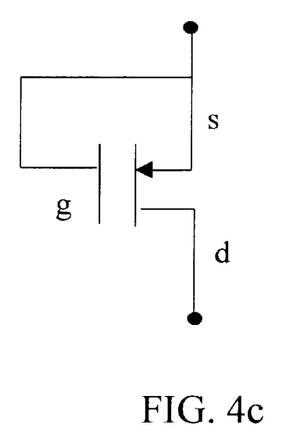
Figure 4D:
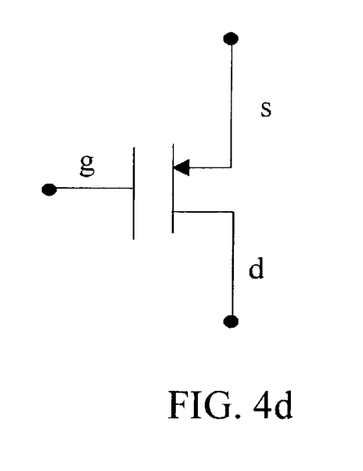
Figure 4E:
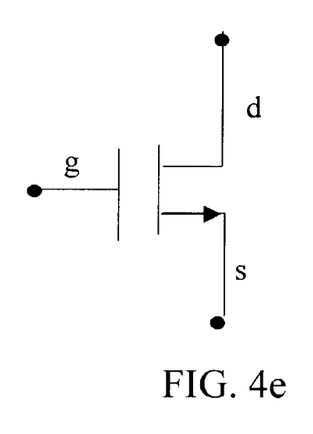

According to the invention, the resistor 210 can be linear or nonlinear, and active or passive. A passive resistor includes an amorphous-silicon (a-Si) thin film, a poly-silicon thin film or a tantalum nitride (TaN). FIG. 4a is a schematic diagram of a passive resistor. An active resistor may be a typical transistor having a gate electrode, a source electrode and a drain electrode. FIGS. 4b–4e are four schematic diagrams of an active resistor. FIG. 4b and FIG. 4c show two schematic diagrams of an active resistor formed by a typical n-type transistor and a typical p-type transistor respectively. An active resistor may also be formed by a typical transistor having a structure of gate, source and drain electrodes. The transistor can also be biased in a linear region, using the gate electrode for control signal, and source and drain electrodes as two ends of a resistor, as shown in FIGS. 4d–4e. In FIGS. 4b–4e, letter g represents gate electrode, letter s represents source electrode and letter d represents drain electrode.

Figure 5A:
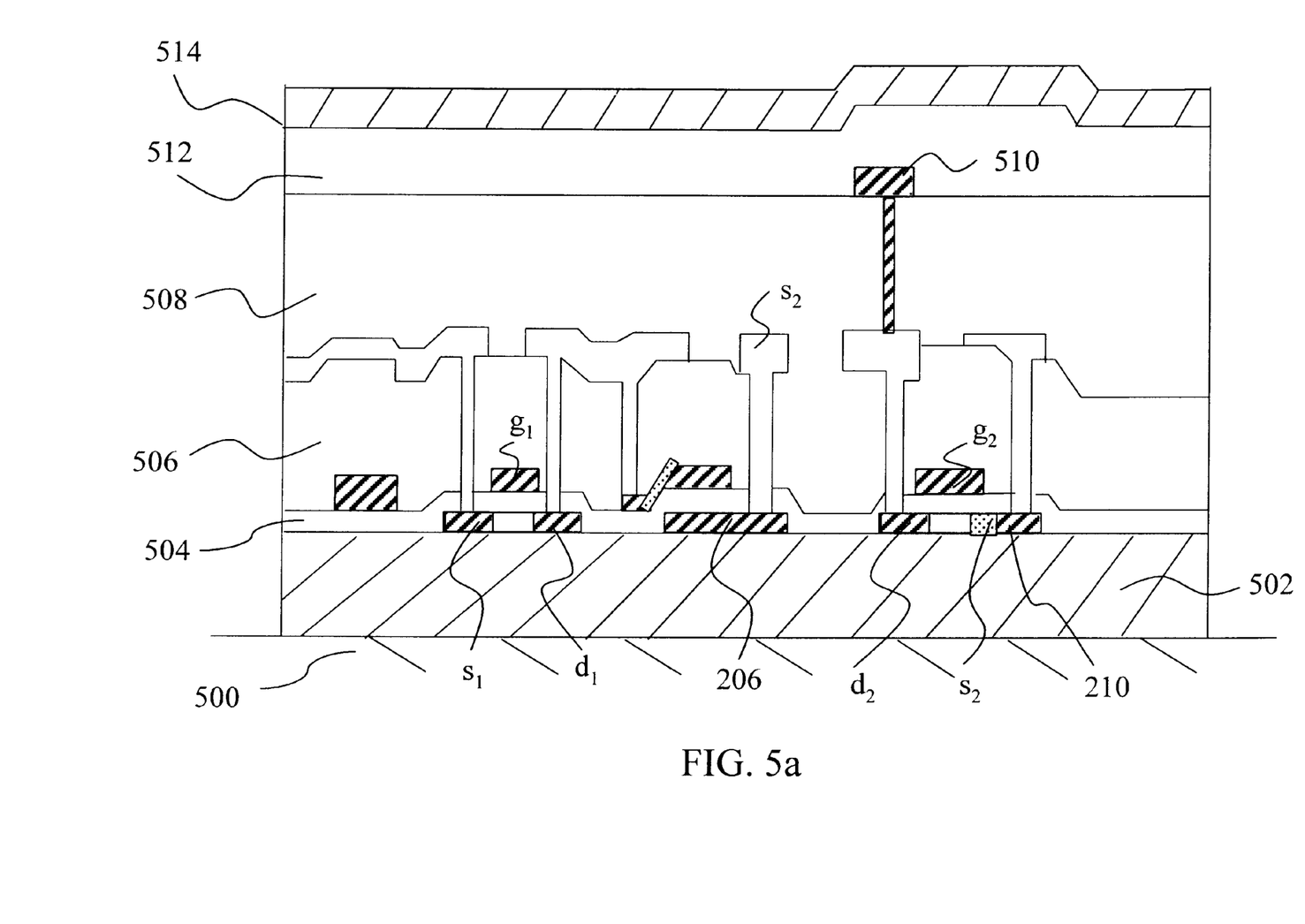
FIG. 5a is a cross-sectional view of FIG. 3 where the second thin film transistor being connected in series with a passive resistor is a p-type TFT.

FIG. 5a is a cross-sectional view of FIG. 3 where the second thin film transistor being connected in series with a passive resistor is a p-type TFT. Referring to FIG. 5a, the pixel structure of an OLED display device of the invention comprises mainly a black matrix region 502 deposited over the top surface of a substrate 500. A buffer layer 504 is deposited over the black matrix region 502 and an interlayer layer 506 is deposited over the buffer layer 504. A passivation layer 508 is deposited over the interlayer layer 506 followed by a layer of transparent material 510. An OEL element 512 is deposited over the layer of the transparent material 510 and the passivation layer 508, and a cathode metal layer 514 is deposited over the OEL element 512. The buffer layer 504 comprises a source region $s_1$ and a drain region $d_1$ of the first TFT 202, a source region $S_2$ and a drain region $d_2$ of the second TFT 204, the storage capacitor 206 and the resistor 210. The resistor 210 is adjacent to the source region $s_2$ and is electrically connected to the storage capacitor 206. As shown in FIG. 5a, the resistor 210 is located at the right-hand side of the source region $s_2$. The interlayer layer 506 comprises a gate layer. The gate layer further comprises a gate region $g_1$ of the first TFT 202 and a gate region $g_2$ of the second TFT 204. According to the invention, the layer of transparent material 510 may be an anode layer of indium-tin-oxide (ITO).

Figure 5B:
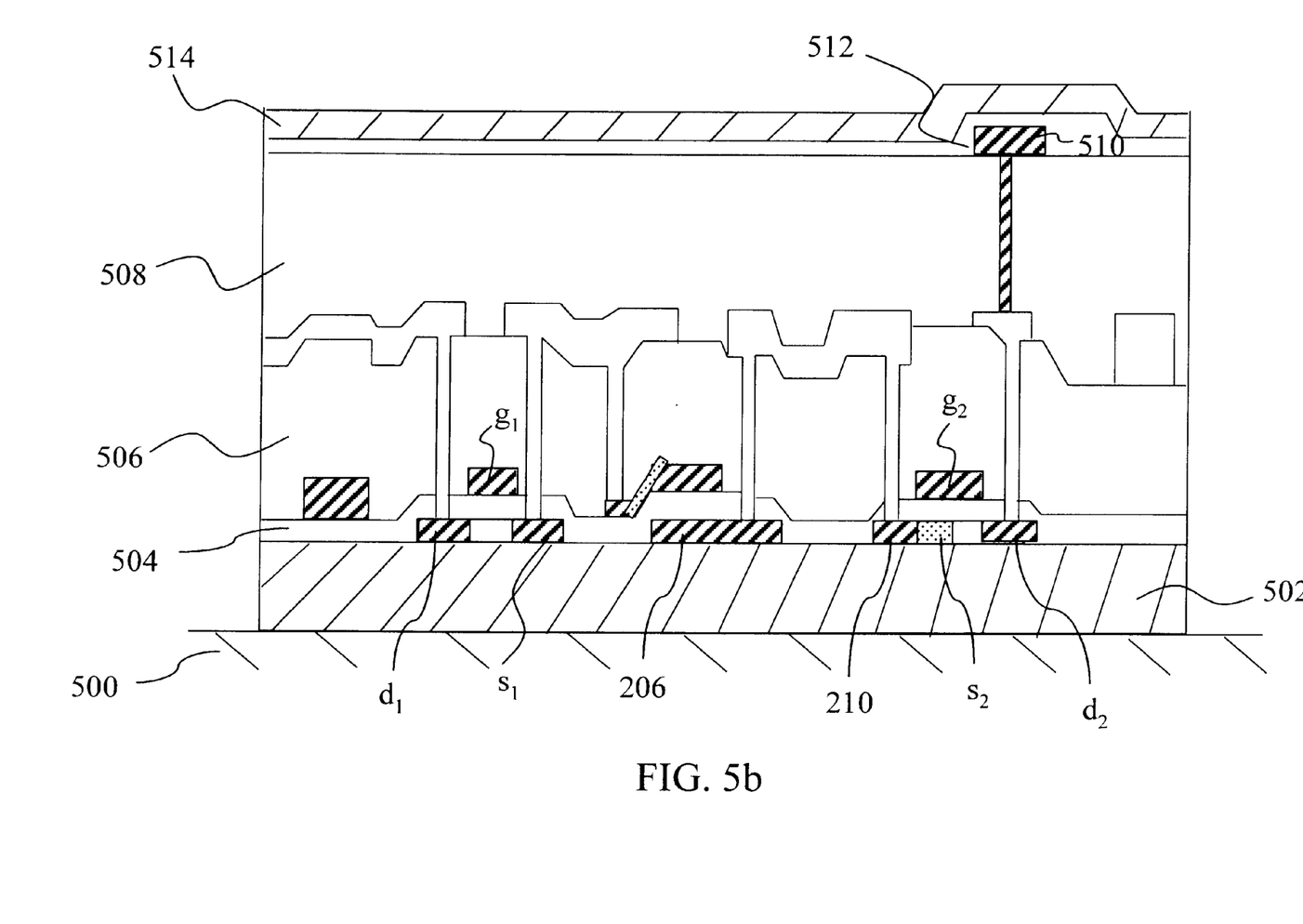
FIG. 5b is a cross-sectional view of FIG. 3 where the second thin film transistor being connected in series with a passive resistor is an n-type TFT.

FIG. 5b is a cross-sectional view of FIG. 3 where the second thin film transistor being connected in series with a passive resistor is an n-type TFT. As compared to FIG. 5a, the resistor 210 is adjacent to the source region $s_2$ and is connected to the ground. As shown in FIG. 5b, the resistor 210 is located at the left-hand side of the source region $s_2$.

Figure 6A:
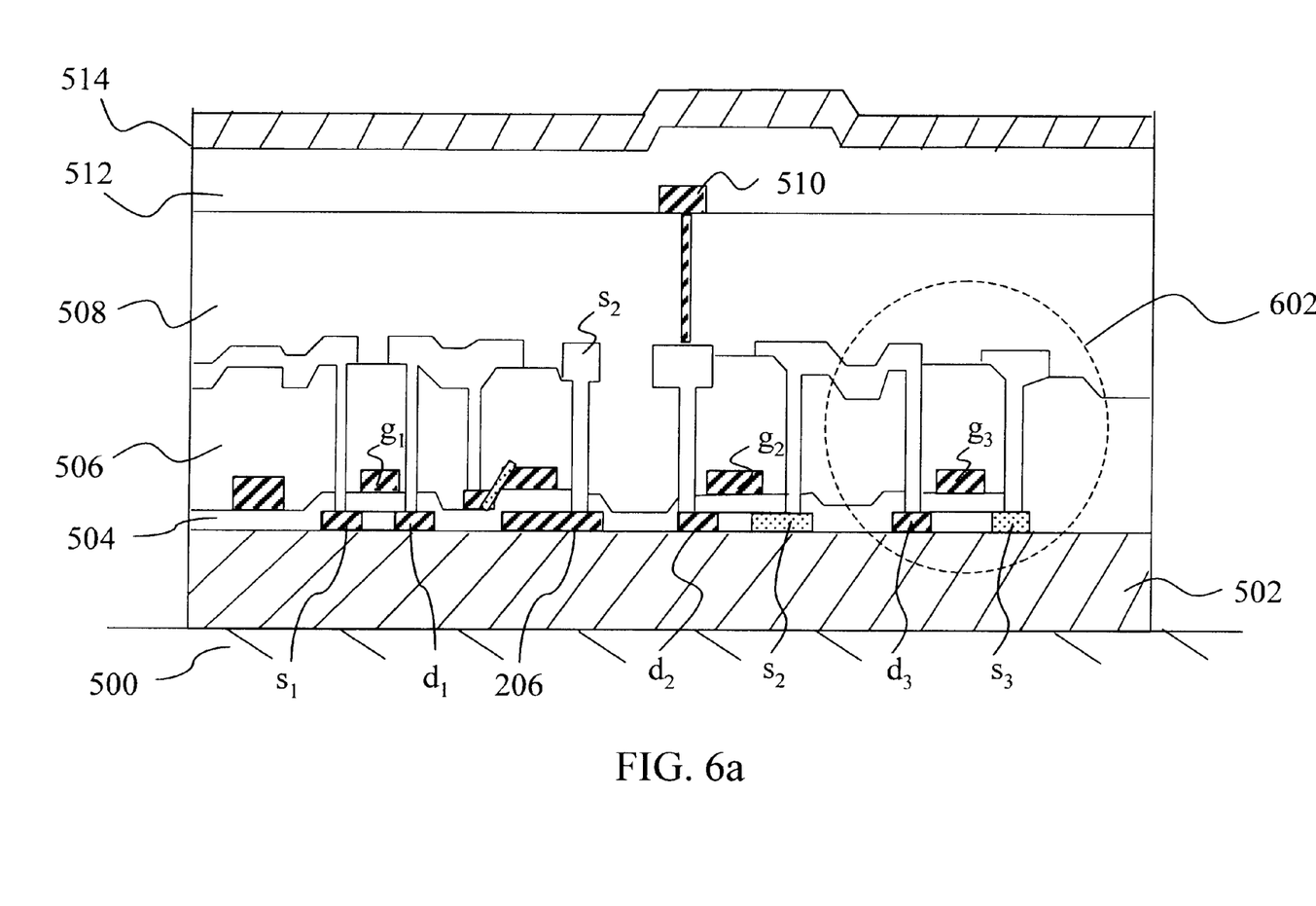
FIG. 6a is a cross-sectional view of FIG. 3 where the second thin film transistor being connected in series with an active resistor is a p-type TFT.

FIG. 6a is a cross-sectional view of FIG. 3 where the second thin film transistor being connected in series with an active resistor is a p-type TFT. As compared to FIG. 5a, the active resistor is a thin film transistor 602 having a drain electrode $d_3$, a source electrode $s_3$ and a gate electrode $g_3$. In this embodiment, the source region $s_2$ of the second TFT 204 is electrically connected to the drain electrode $d_3$ of the TFT 602. According to the invention, the source region $s_2$ of the second TFT 204 may also be designed as being electrically connected to the source electrode $s_3$ of the TFT 602.

Figure 6B:
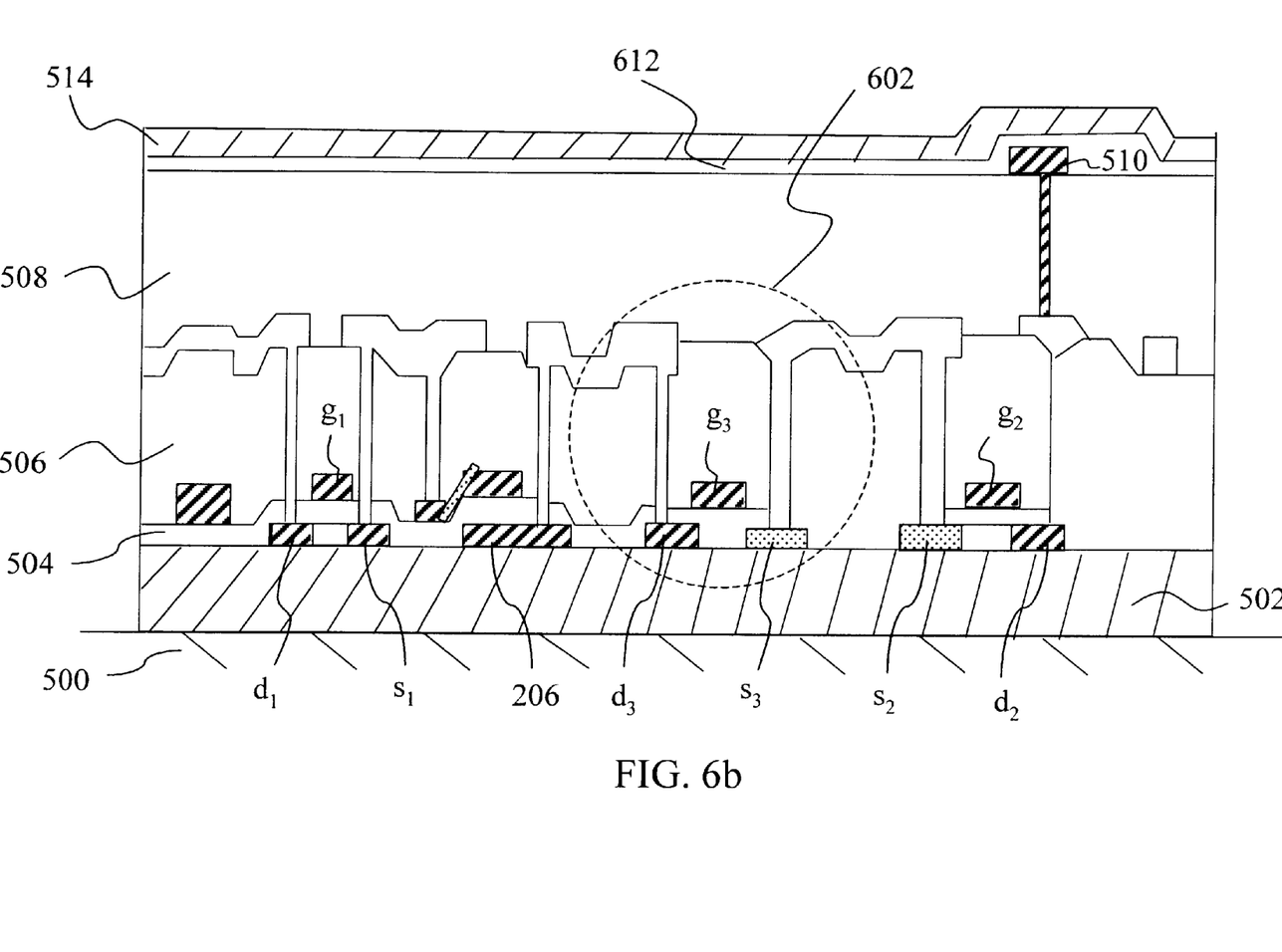
FIG. 6b is a cross-sectional view of FIG. 3 where the second thin film transistor being connected in series with an active resistor is an n-type TFT.

FIG. 6b is a cross-sectional view of FIG. 3 where the second thin film transistor being connected in series with an active resistor is an n-type TFT. As compared to FIG. 5b, the active resistor is a thin film transistor 602 having a drain electrode $d_3$, a source electrode $s_3$ and a gate electrode $g_3$. The source region $s_2$ of the second TFT 204 is electrically connected to the source electrode $s_3$ of the TFT 602 and the storage capacitor 206 is electrically connected to the drain electrode $d_3$. According to the invention, the source region $s_2$ of the second TFT 204 may also be electrically connected to the drain electrode $d_3$ of the TFT 602 and the storage capacitor 206 may be electrically connected to the source electrode $s_3$ of the TFT 602.

Figure 7:
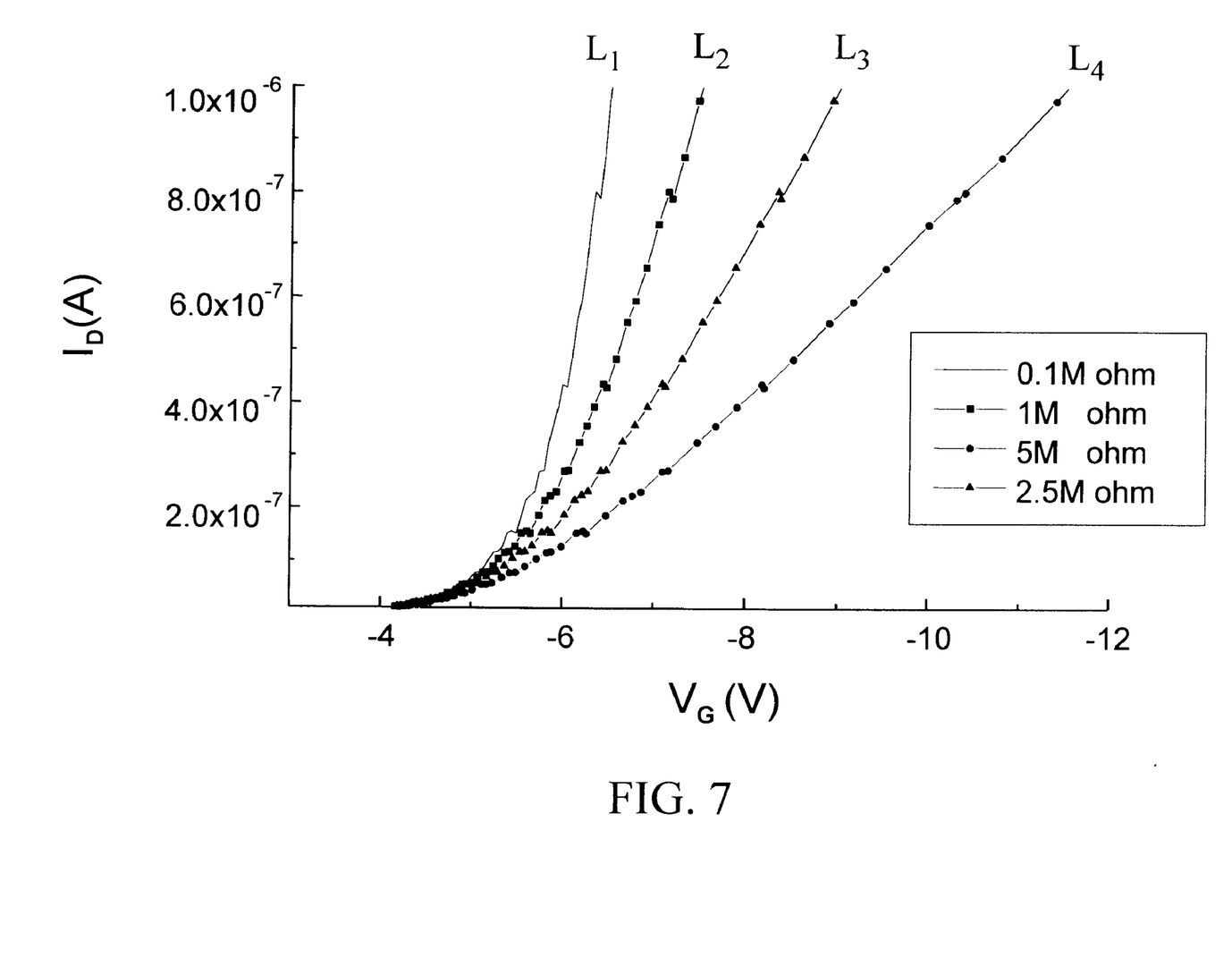
FIG. 7 shows the current-voltage characteristic curves when a resistor of various resistance levels is connected in series with the source electrode of the second TFT on a pixel structure of an OLED display device according to the invention.

FIG. 7 shows the current-voltage characteristic curves when a resistor of various resistance levels is connected in series with the source electrode of the second TFT on a pixel structure of the OLED display device according to the invention. As shown in FIG. 7, the horizontal axis represents the gate voltage $V_g$ of the second TFT with volt as a unit. And the vertical axis represents the drain current $I_d$ of the second TFT with ampere as a unit. Curves $L_1$, $L_2$, $L_3$ and $L_4$ show the characteristics of the drain current $I_d$ versus the gate voltage $V_g$ when the resistance is less than 1 million ohms (MΩ), equal to 1 MΩ, equal to 2.5 MΩ and equal to 5 MΩ, respectively. As shown in FIG. 7, when the resistance of the resistor is in the MΩ level, the current-voltage characteristic curves $L_2$, $L_3$ and $L_4$ have more linear relationship.

Figure 8:
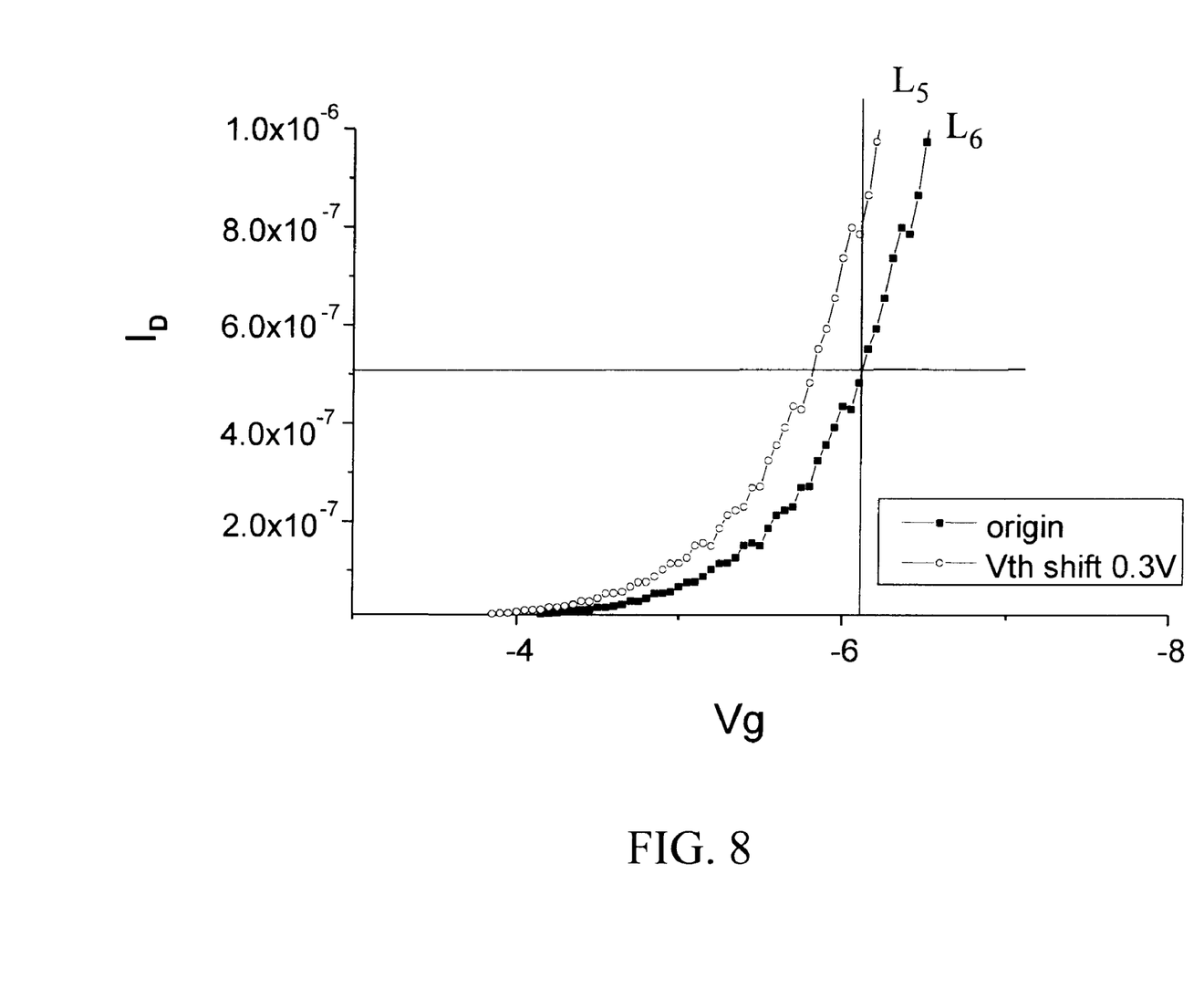
FIG. 8 shows that the thin film transistor is operated in a saturated region, and when the threshold voltage of the transistor has a shift, the uniformity problem among pixels at high gray levels is much worse than that among pixels at low gray levels.

Because the second TFT is operated in a saturated region, the characteristic curve of the drain current $I_d$ versus the gate voltage $V_g$ is non-linear. Since the voltage difference at high gray levels of brightness is smaller than that at low gray levels of brightness, the gray-level switching of the driving system is more difficult. FIG. 8 shows that the thin film transistor is operated in a saturated region and when the threshold voltage of the transistor has a shift, the uniformity problem among pixels at high gray levels is much worse than that among pixels at low gray levels. The curve $L_5$ in FIG. 8 shows the characteristic of the drain current $I_d$ versus the gate voltage $V_g$ when the threshold voltage has no shift. The curve $L_6$ shows the characteristic of the drain current $I_d$ versus the gate voltage $V_g$ when the threshold voltage has a shift of 0.3 volts.

Figure 9:
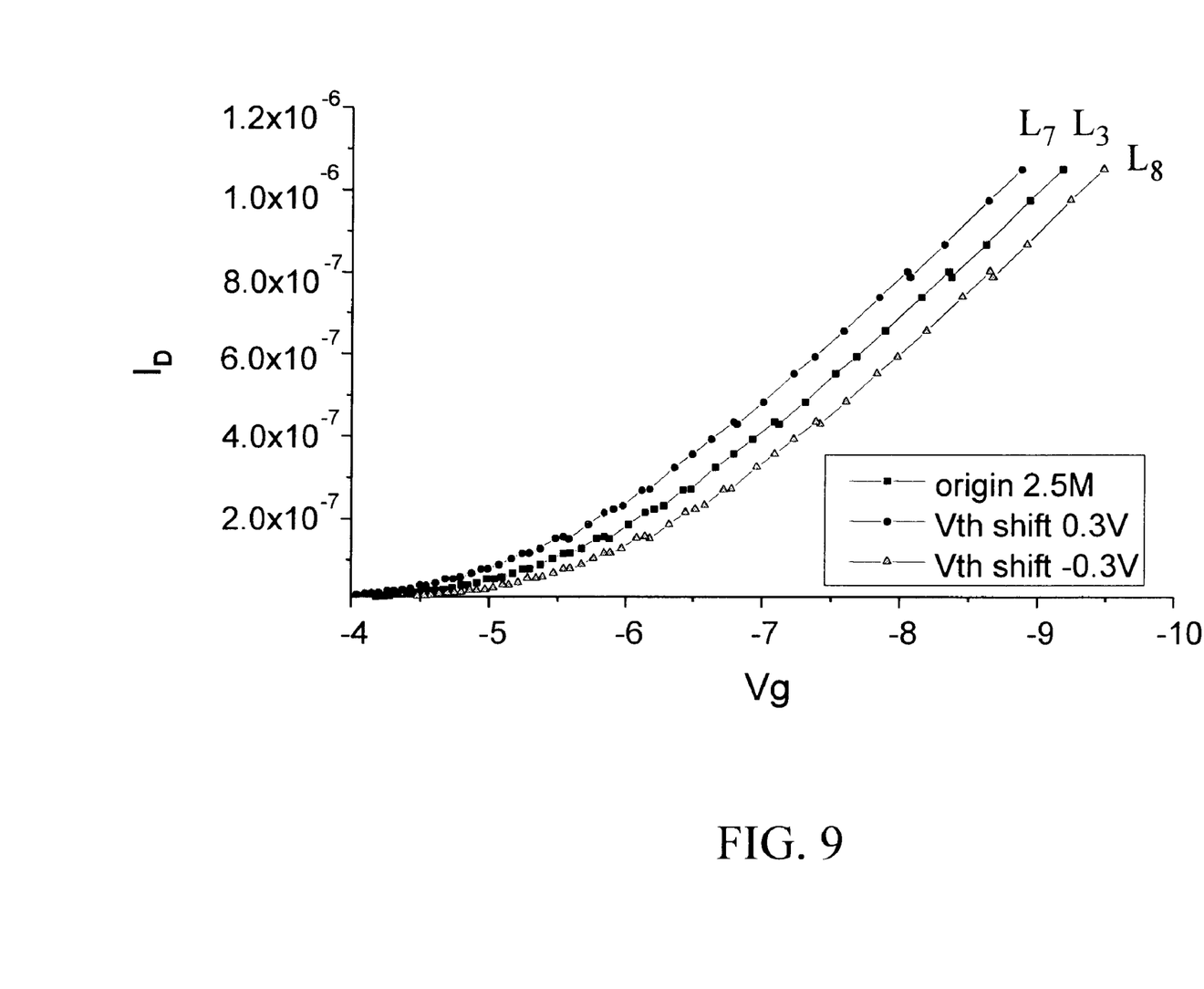
FIG. 9 shows the effect to the threshold voltage of the thin film transistor by adding a resistor on a pixel structure of an OLED display device according to the invention.

FIG. 9 shows the effect to the threshold voltage of the thin film transistor by adding a resistor on a pixel structure of the OLED display device according to the invention. As shown in FIG. 9, the curve $L_3$ shows the characteristic of the drain current $I_d$ versus the gate voltage $V_g$ when the resistance is equal to 2.5 MΩ. The curve $L_7$ shows the characteristic of the drain current $I_d$ versus the gate voltage $V_g$ when the threshold voltage has a shift of 0.3 volts. The curve $L_8$ shows the characteristic of the drain current $I_d$ versus the gate voltage $V_g$ when the threshold voltage has a shift of −0.3 volts. As shown in FIG. 9, although the threshold voltages are different, the differences among the curves $L_3$, $L_7$ and $L_8$ are not obvious. These three curves are more linear and the uniformity among pixels at high gray level tends to be constant. Therefore, the switching of gray-level brightness becomes easier and the effect of non-uniform pixel illumination is improved.

Although this invention has been described with a certain degree of particularity, it is to be understood that the present disclosure has been made by way of preferred embodiments only and that numerous changes in the detailed construction and combination as well as arrangement of parts may be restored to without departing from the spirit and scope of the invention as hereinafter set forth.

What is claimed is:

1. A pixel structure of an organic light-emitting diode (OLED) display device, comprising:
   a black matrix region deposited and defined on a surface of an insulating substrate;
   a buffer layer being deposited over said black matrix region and comprising source and drain electrode regions of a first thin-film-transistor, source and drain electrode regions of a second thin-film-transistor, a storage capacitor and a resistor, said resistor being adjacent to said source region of said second thin-film-transistor and electrically connected to said storage capacitor;
   an interlayer being deposited over said buffer layer and comprising a gate layer, said gate layer having a gate region of said first thin-film-transistor and a gate region of said second thin-film-transistor;
   a passivation layer deposited over said interlayer layer; and
   an organic electroluminescent element deposited over said passivation layer;
      wherein said resistor has a first end connected in series with the source electrode of said second thin film transistor and a second end connected to a ground or voltage source.

2. The pixel structure of an OLED display device as claimed in claim 1, said resistor being an active resistor formed by a transistor having a structure of gate, source, and drain electrodes.

3. The pixel structure of an OLED display device as claimed in claim 1, said resistor being an active resistor formed by a transistor biased in a linear region with a gate electrode for a control signal, and source and drain electrodes as two ends of said resistor.

4. The pixel structure of an OLED display device as claimed in claim 1, said resistor being a passive resistor including an amorphous-silicon thin film, a poly-silicon thin film or a tantalum nitride.

5. The pixel structure of an OLED display device as claimed in claim 1, said resistor having a resistance level from several million ohms to several tens of million ohms.

6. The pixel structure of an OLED display device as claimed in claim 1, said resistor being connected in series with said source electrode of said second thin film transistor.

7. The pixel structure of an OLED display device as claimed in claim 1, said second thin film transistor being an n-type thin film transistor.

8. The pixel structure of an OLED display device as claimed in claim 7, said resistor having a first end connected in series with said source electrode of said second thin film transistor and a second end connected to the ground.

9. The pixel structure of an OLED display device as claimed in claim 1, said second thin film transistor being a p-type thin film transistor.

10. The pixel structure of an OLED display device as claimed in claim 9, said resistor having a first end connected in series with said source electrode of said second thin film transistor and a second end connected to a voltage source.

11. The pixel structure of an OLED display device as claimed in claim 1, said organic electroluminescent element further comprising:

a layer of transparent material deposited over said passivation layer;

a layer of organic electroluminescent semiconductor deposited over said layer of transparent material and said passivation layer; and a cathode metal layer deposited over said organic electroluminescent semiconductor.

12. The pixel structure of an OLED display device as claimed in claim 11, said layer of organic electroluminescent semiconductor being an organic light-emitting diode.

13. The pixel structure of an OLED display device as claimed in claim 11, said layer of transparent material being an anode layer of indium-tin-oxide.

\* \* \* \* \*